(12) United States Patent  (10) Patent No.: US 9,265,153 B2
Wu  (45) Date of Patent: Feb. 16, 2016

(54) PHOTOELECTRIC COUPLING MODULE CAPABLE OF PACKAGING FIRMLY

(71) Applicant: HON HAI PRECISION INDUSTRY CO., LTD., New Taipei (TW)

(72) Inventor: Kai-Wen Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 209 days.

(21) Appl. No.: 13/973,993

(22) Filed: Aug. 22, 2013

(65) Prior Publication Data

US 2014/0209791 A1 Jul. 31, 2014

(30) Foreign Application Priority Data

Jan. 31, 2013 (TW) .................................. 102103713

(51) Int. Cl.
*H01S 5/022* (2006.01)
*H05K 1/18* (2006.01)
*G02B 6/42* (2006.01)

(52) U.S. Cl.
CPC .............. *H05K 1/183* (2013.01); *G02B 6/4206* (2013.01); *G02B 6/428* (2013.01); *G02B 6/4214* (2013.01); *G02B 6/4249* (2013.01); *G02B 6/4292* (2013.01); *H05K 2201/09036* (2013.01); *H05K 2201/09072* (2013.01); *H05K 2201/10121* (2013.01); *H05K 2201/2018* (2013.01)

(58) Field of Classification Search
CPC .. G02B 6/4206; G02B 6/4214; G02B 6/4249; G02B 6/428; G02B 6/4292
See application file for complete search history.

(56) References Cited

U.S. PATENT DOCUMENTS

| | | | | |
|---|---|---|---|---|
| 4,644,166 | A * | 2/1987 | Sturm et al. | 250/372 |
| 8,981,279 | B2 * | 3/2015 | Lin | 250/216 |
| 8,993,450 | B2 * | 3/2015 | Sherrer | 438/704 |

* cited by examiner

*Primary Examiner* — Tony Ko

(74) *Attorney, Agent, or Firm* — Novak Druce Connolly Bove + Quigg LLP

(57) ABSTRACT

A photoelectric coupling module includes a substrate, a photoelectric unit, and a lens module. The substrate defines a positioning recess. The photoelectric unit is positioned on the substrate. The lens module includes a reflection surface, a plurality of first lenses, and a plurality of second lens. Optical axes of the first lenses cross optical axes of the second lenses on the reflection surface. The lens module further includes a positioning portion extending downward from a bottom surface, and the positioning portion is received in the positioning recess. The first lenses are aligned with the photoelectric unit.

16 Claims, 3 Drawing Sheets

PHOTOELECTRIC COUPLING MODULE CAPABLE OF PACKAGING FIRMLY

BACKGROUND

1. Technical Field

The present disclosure relates to photoelectric technologies and, particularly, to a photoelectric coupling module.

2. Description of Related Art

Photoelectric coupling modules generally include a substrate, a photoelectric unit, and a lens module. The photoelectric unit is positioned on and electrically connected to the substrate. The lens module is supported on the substrate, covering the photoelectric unit, and includes lenses aligned with the photoelectric unit. If the photoelectric unit is not aligned with the lenses of the lens module, an optical usage efficiency of the photoelectric coupling module is decreased.

Therefore, it is desirable to provide a photoelectric coupling module that can overcome the limitations described.

DETAILED DESCRIPTION

Embodiments of the disclosure will be described with reference to the drawings.

Figure 1:
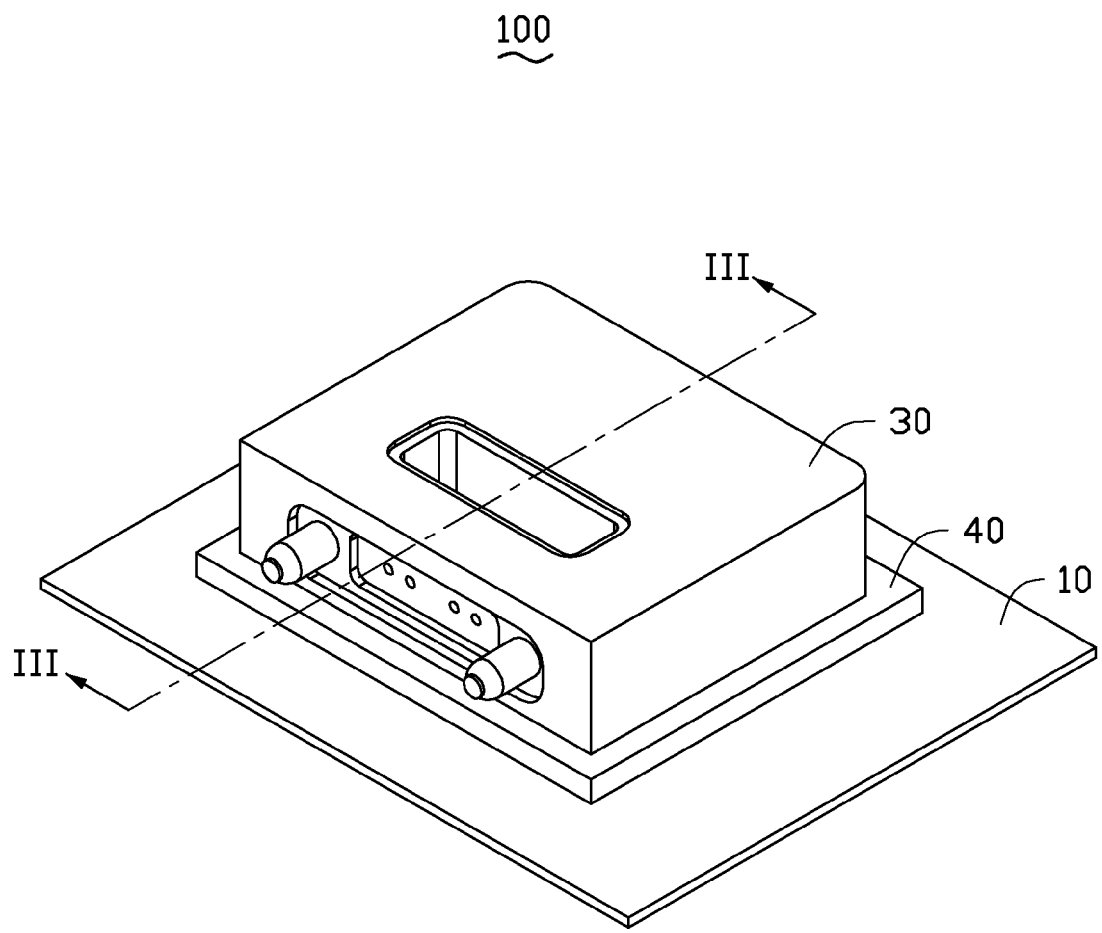
FIG. 1 is a schematic view of a photoelectric coupling module in accordance with an exemplary embodiment.
Figure 2:
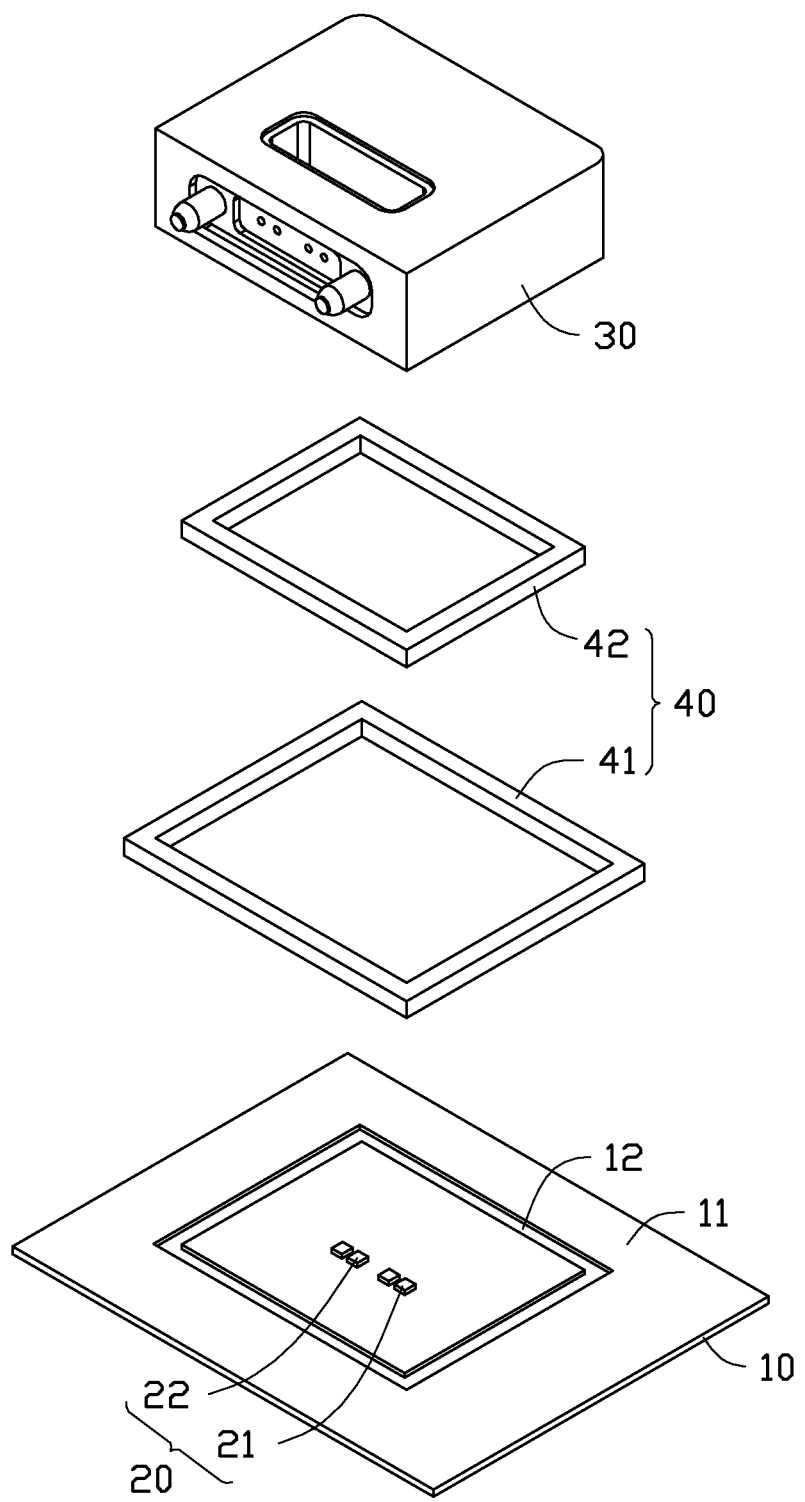
FIG. 2 is an isometric, exploded, and schematic view of the photoelectric coupling module of FIG. 1.
Figure 3:
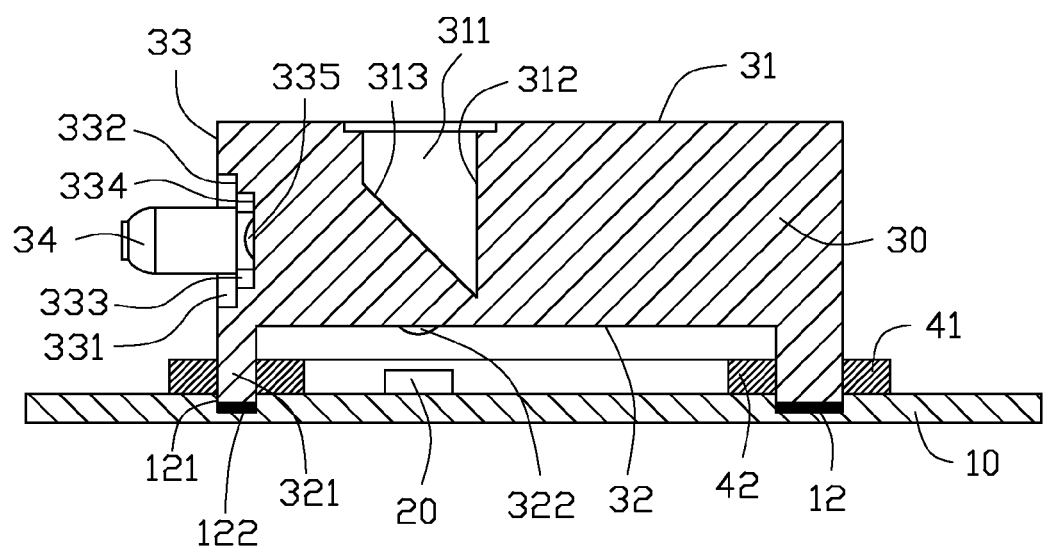
FIG. 3 is a cross-sectional view taken along a line III-III of FIG. 1.

FIGS. 1-3 show a photoelectric coupling module 100, according to an exemplary embodiment. The photoelectric coupling module 100 includes a substrate 10, a photoelectric unit 20, a lens module 30, and a limiting element 40.

The substrate 10 is a printed circuit board and includes a bearing surface 11. The substrate 10 defines a positioning recess 12 in the bearing surface 11. The substrate 10 has two opposite sidewalls 121 positioned in the bearing surface 11, and a bottom wall 122 positioned below the bearing surface 11 and coupling the two opposite sidewalls 121. The two opposite sidewalls 121 and the bottom wall 122 cooperatively form the positioning recess 12. The positioning recess 12 is substantially rectangular but can take other forms in other embodiments.

The photoelectric unit 20 is positioned on the bearing surface 11, and includes at least one light emitter 21, such as a laser diode, and at least one light receiver 22, such as a photo diode. The at least one light emitter 21 is electrically connected to the substrate 10, and converts electronic signals into corresponding light signals in a form of light rays. The at least one light receiver 22 is electrically connected to the substrate 10, and receives and converts light rays into corresponding electronic signals. The number of the at least one light emitter 21 is equal to the number of the at least one light receiver 22. The at least one light emitter 21 and the at least one light receiver 22 are linearly arranged.

In the embodiment, the photoelectric unit 20 includes two light emitters 21 and two light receivers 22 arrayed collinear with the light receivers 21.

The lens module 30 is a cuboid and is made of transparent material, such as plastic or glass. The lens module 30 is supported on the substrate 10. The lens module 30 includes a top surface 31, a bottom surface 32, and two side surfaces 33. The bottom surface 32 is opposite to the top surface 31, and the side surfaces 33 are opposite to each other. The side surfaces 33 are substantially perpendicularly connected between the top surface 31 and the bottom surface 32.

The lens module 30 defines an elongated first recess 311 in the top surface 31. A cross-section of the first recess 311 taken along a direction that is substantially perpendicular to lengthwise of the first recess 311 is triangular. The first recess 311 includes an inner surface 312 substantially perpendicular to the top surface 31 and a reflection surface 313 tilting about 45 degrees relative to the inner surface 312.

A positioning portion 321 extends from the bottom surface 32 of the lens module 30. The positioning portion 321 is adjacent to an edge of the bottom surface 32, and is coplaner with a sidewall of the lens module 30. In the embodiment, a thickness of the positioning portion 321 is slightly less than a width of the positioning recess 12. A number of first lenses 322 are formed on the bottom surface 32, located within an orthogonal projection of the reflection surface 313 onto the bottom surface 32. In the embodiment, the first lenses 322 are convex lenses. The first lenses 322 are arrayed collinear and face the reflection surface 313, and are surrounded by the positioning portion 321.

The lens module 30 defines a second recess 331 in one of the side surfaces 33. The second recess 331 includes a first surface 332 substantially parallel to the side surface 33. At least two coupling portions 34 extend outward from the first surface 332. The lens module 30 defines a third recess 333 in the first surface 332. The third recess 333 includes a second surface 334 substantially parallel to the first surface 332. A number of second lens 335 are formed on the second surface 334, located within an orthogonal projection of the reflection surface 313 onto the side surface 33. In the embodiment, the second lenses 335 are convex lenses. The second lenses 335 are arrayed collinear and face the reflection surface 313, and are received in the third recess 333.

The number of the second lenses 335 is equal to the number of the first lenses 322. In the embodiment, the number of the first lenses 322 or the second lenses 335 is four. An optical axis of each second lens 335 is perpendicular to an optical axis of each first lens 322. The optical axes of the first lenses 322 cross the optical axes of the second lenses 335 on the reflection surface 313.

The limiting element 40 is rectangular and is made of opaque materials. The limiting element 40 is positioned on the substrate 10, and includes a first annular portion 41 and a second annular portion 42 surrounded by the first annular portion 41. The positioning recess 12 is defined between the first annular portion 41 and the second annular portion 42. A distance between the first annular portion 41 and the second annular portion 42 is substantially equal to the thickness of the positioning portion 321.

In assembly, the light emitters 21 and the light receivers 22 are mounted on the bearing surface 11 by a surface-mount technology (SMT). The light emitters 21 and the light receivers 22 are surrounded by the positioning recess 12. The limiting element 40 is added on the bearing surface 11 by glue. A little of glue is injected into the positioning recess 12, the positioning portion 321 is received in the positioning recess 12, resist the bottom wall 122 and glued by the little of glue. The positioning portion 321 further contacts at least one of the two opposite sidewalls 121 fully to increase resistance between the positioning portion 321 and the two opposite sidewalls 121 so as to prevent itself from slipping out the positioning recess 12, and further prevent itself from shaking relative to the substrate 10. The lens module 30 is connected to the substrate 10 by the glue received in the positioning recess 12. The first annular portion 41 and the second annular portion 42 surround the positioning portion 321. The first annular portion 41 contacts an external surface of the positioning portion 321, and the second annular portion 42 contacts an internal surface of the positioning portion 321. The light emitters 21 and the light receivers 22 are surrounded by the positioning portion 321. The first lenses 322 face the light emitters 21 and the light receivers 22. The optical axes of the first lenses 322 are aligned with the light emitters 21 and the light receivers 22.

During the process of emitting the light rays, the light emitters 21 emit light rays to the first lenses 322 along a direction perpendicular to the bottom surface 32. The light rays are converged by the first lenses 322, and are projected onto the reflection surface 313. The reflection surface 313 reflects the light rays to the second lenses 335.

During the process of receiving light rays, the light rays enter into the lens module 30 through the second lenses 335. The light rays are converged by the second lenses 335, and are projected onto the reflection surface 313. The reflection surface 313 reflects the light rays to the first lenses 322. The light rays are converged by the first lenses 323, and are projected to the light receivers 22. The light receivers 22 convert the light rays into electronic signals, and the electronic signals are transmitted to the substrate 10.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A photoelectric coupling module, comprising:
a substrate comprising a bearing surface, and further comprising two opposite sidewalls positioned in the bearing surface and a bottom wall positioned below the bearing surface and coupling the two opposite sidewalls, and defining a positioning recess formed by the two opposite sidewalls and the bottom wall in the bearing surface;
a photoelectric unit positioned on the bearing surface; and
a lens module comprising a top surface, a bottom surface opposite to the top surface, and a side surface connected between the top surface and the bottom surface; the lens module defining a first recess on the top surface, the first recess comprising a reflection surface tilting about 45 degrees relative to the bearing surface; the lens module comprising a plurality of first lenses formed on the bottom surface, a positioning portion extending downward from the bottom surface, and a plurality of second lenses formed on the side surface; optical axes of the first lenses crossing optical axes of the second lenses on the reflection surface; the positioning portion received in the positioning recess and glued to the bottom wall by glue; the first lenses aligned with the photoelectric unit;
wherein a thickness of the positioning portion is slightly less than a width of the positioning recess, the positioning portion contacts at least one of the two opposite sidewalls fully to prevent the positioning portion from slipping out the positioning recess.

2. The photoelectric coupling module of claim 1, comprising a limiting element positioned on the bearing surface, wherein the positioning portion is limited by the limiting element.

3. The photoelectric coupling module of claim 2, wherein the limiting element comprises a first annular portion and a second annular portion surrounded by the first annular portion; the first annular portion and the second annular portion cooperatively limit the positioning portion.

4. The photoelectric coupling module of claim 3, wherein the limiting element is made of opaque materials.

5. The photoelectric coupling module of claim 1, wherein the number of the first lenses is equal to the number of the second lenses.

6. The photoelectric coupling module of claim 1, wherein the first lenses are surrounded by the positioning portion.

7. The photoelectric coupling module of claim 1, wherein the positioning recess surrounds the photoelectric unit.

8. A photoelectric coupling module, comprising:
a substrate having two opposite sidewalls and a bottom wall coupling the two opposite sidewalls and defining a positioning recess formed by the two opposite sidewalls and the bottom wall;
a photoelectric unit positioned on the substrate; and
a lens module comprising a reflection surface, a plurality of first lenses, and a plurality of second lens; optical axes of the first lenses crossing optical axes of the second lenses on the reflection surface; the lens module further comprising a positioning portion extending downward from a bottom surface thereof, the positioning portion received in the positioning recess and glued to the bottom wall by glue; the first lenses aligned with the photoelectric unit;
wherein a thickness of the positioning portion is slightly less than a width of the positioning recess, the positioning portion contacts at least one of the two opposite sidewalls fully to prevent the positioning portion from slipping out the positioning recess.

9. The photoelectric coupling module of claim 8, comprising a limiting element positioned on the bearing surface, wherein the positioning portion is limited by the limiting element.

10. The photoelectric coupling module of claim 9, wherein the limiting element comprises a first annular portion and a second annular portion surrounded by the first annular portion; the first annular portion and the second annular portion cooperatively limit the positioning portion.

11. The photoelectric coupling module of claim 10, wherein the limiting element is made of opaque materials.

12. A photoelectric coupling module, comprising:
a substrate comprising a bearing surface, and further comprising two opposite sidewalls positioned in the bearing surface and a bottom wall positioned below the bearing surface and coupling the two opposite sidewalls, and defining a positioning recess formed by the two opposite sidewalls and the bottom wall in the bearing surface;
a photoelectric unit positioned on the bearing surface;
a lens module comprising a top surface, a bottom surface opposite to the top surface, and a side surface connected between the top surface and the bottom surface; the lens module defining a first recess on the top surface, the first recess comprising a reflection surface tilting about 45 degrees relative to the bearing surface; the lens module comprising a plurality of first lenses formed on the bottom surface, a positioning portion extending downward from the bottom surface, and a plurality of second lenses formed on the side surface; optical axes of the first lenses crossing optical axes of the second lenses on the reflection surface; the positioning portion received in the positioning recess and glued to the bottom wall by glue; the first lenses aligned with the photoelectric unit; and a limiting element comprising a first annular portion positioned on the bearing surface and a second annular portion positioned on the bearing surface and surrounded by the first annular portion;

wherein a thickness of the positioning portion is slightly less than a width of the positioning recess, the positioning portion contacts at least one of the two opposite sidewalls fully to prevent the positioning portion from slipping out the positioning recess;

wherein the positioning portion locates between the first annular portion and the second annular portion, the first annular portion and the second annular portion both contact the positioning portion to further prevent the positioning portion from slipping out the positioning recess.

13. The photoelectric coupling module of claim 12, wherein the limiting element is made of opaque materials.

14. The photoelectric coupling module of claim 12, wherein the number of the first lenses is equal to the number of the second lenses.

15. The photoelectric coupling module of claim 12, wherein the first lenses are surrounded by the positioning portion.

16. The photoelectric coupling module of claim 12, wherein the positioning recess surrounds the photoelectric unit.

* * * * *